United States Patent

Ranaweera et al.

[11] Patent Number: 6,034,896
[45] Date of Patent: Mar. 7, 2000

[54] METHOD OF FABRICATING A FAST PROGRAMMABLE FLASH E²PROM CELL

[75] Inventors: Jeewika Chandanie Ranaweera, Ontario, Canada; Ivan Kalastirsky, Folsom, Calif.; Elvira Gulersen, Ontario, Canada; Wai Tung Ng, Ontario, Canada; Clement Andre T. Salama, Ontario, Canada

[73] Assignee: The University of Toronto, Innovations Foundation, Toronto, Canada

[21] Appl. No.: 08/981,745

[22] PCT Filed: Jul. 3, 1996

[86] PCT No.: PCT/CA96/00446

§ 371 Date: Jun. 24, 1998

§ 102(e) Date: Jun. 24, 1998

[87] PCT Pub. No.: WO97/02605

PCT Pub. Date: Jan. 23, 1997

Related U.S. Application Data

[60] Provisional application No. 60/001,046, Jul. 3, 1995.

[51] Int. Cl.⁷ .................................................... G11C 16/04
[52] U.S. Cl. ............................. 365/185.28; 365/185.29; 257/316; 257/326
[58] Field of Search .................... 365/185.28, 185.18, 365/185.24, 185.29; 257/315, 316, 324, 326

[56] References Cited

U.S. PATENT DOCUMENTS

| | | | |
|---|---|---|---|
| 4,203,158 | 5/1980 | Frohman-Bentchkowsky et al. | 365/185 |
| 5,130,769 | 7/1992 | Kuo et al. | 357/23.5 |
| 5,311,049 | 5/1994 | Tsuruta | 365/185 |
| 5,464,785 | 11/1995 | Hong | 437/43 |
| 5,719,427 | 2/1998 | Tong et al. | 257/355 |
| 5,895,950 | 4/1999 | Walker et al. | 257/315 |

FOREIGN PATENT DOCUMENTS 0 642 172 A1  8/1994  European Pat. Off. .

OTHER PUBLICATIONS

"FCAT—A–Low–Voltage High–Speed Alterable n–Channel Nonvolatile Memory Device", IEEE Transactions on Electron Devices, vol. ED–26, No. 6, Jun. 1979.

"A Fast Programming Flash ZE² PROM Cell for Embedded Applications", J. Ranaweera, et al., Department of Electrical and Computer Engineering, University of Toronto, Canada.

"A Fully Decoded 2048–Bit Electrically Programmable FAMOS Read–Only Memory", IEEE J. Solid–State Circuits, vol. SC–6, No. 5, pp. 301–306, Oct. 1971.

"An Erase Model for FAMOS EPROM Devices", IEEE Trans. Electron Devices, vol. ED–27, No. 9, pp. 1744–1752, Sep. 1980.

*Primary Examiner*—Son Mai
*Attorney, Agent, or Firm*—Fay, Sharpe, Fagan, Minnich & McKee, LLP

[57] ABSTRACT

A flash E²PROM cell having source and drain regions disposed in a substrate, a channel region intermediate to the source and drain regions, a tunnel dielectric layer overlying the channel region, a floating gate overlying the tunnel dielectric layer, an inter-poly dielectric layer overlying the floating gate, and a control gate overlying the inter-poly dielectric layer. The flash E²PROM cell further having a highly doped p⁺ pocket implant covering a portion of the cell width and adjacent to at least one of the drain and source regions. The flash E²PROM cell is comprised of two sections butted together. The portion (width-wise) that is covered by the highly doped p⁺ pocket implant is referred to as a program section. The remaining portion (width-wise) not covered by the highly doped p⁺ pocket implant resembles a conventional flash E²PROM cell and is referred to as a sense section. The highly doped p⁺ pocket implant and the n⁺ drain and/or source regions create a junction having narrow depletion width so that when the junction is reversed biased, an electric field is created for generating hot electrons for storage on the floating gate, thereby programming the flash E²PROM cell when a high positive potential is applied to the control gate.

15 Claims, 14 Drawing Sheets

METHOD OF FABRICATING A FAST PROGRAMMABLE FLASH E²PROM CELL

This application is a 371 of PCT/CA96/00446 filed Jul. 03, 1996, provisional application No. 60/001,046 filed Jul. 03, 1995.

FIELD OF THE INVENTION

The present invention relates in general to Electrically Erasable and Programmable Read-Only Memory (E²PROM), and more particularly to a method of fabricating a flash E²PROM with fast programming speed and low operating voltages.

BACKGROUND OF THE INVENTION

Flash memory is a modified form of E²PROM which can be erased one block at a time and can be programmed one bit at a time. At the time of filing this application, flash memory chips are available in densities of up to 32M bits. Large data storage capacity with complete nonvolatility, results in numerous applications for such chips, ranging from cellular telephones, solid-state disks and memory cards. Such applications have traditionally been the domain of ROM, conventional E²PROM, battery-backed RAM, static RAM (SRAM) and magnetic storage.

A flash E²PROM cell resembles an ordinary MOS (Metal-Oxide-Semiconductor) transistor, except for the addition of a floating gate, which is buried in the insulator between the substrate and the conventional control gate. Charge stored on the floating gate alters the threshold voltage ($V_{th}$) of the device as measured at the control gate. Since the floating gate and the control gate are both stacked directly above the transistor channel, very high densities can be achieved. Even higher densities can be obtained by self aligning the control and floating gates to the source and drain regions.

The cell is programmed and erased by adding electrons to and removing electrons from the floating gate, respectively. A cell with a high threshold voltage ($V_{th}$) is in its "0" state. After erasure has been completed, the threshold voltage is reduced resulting in a "1" state. The conductivity of the channel determines the information stored in the memory cell (i.e. current flowing through the channel is detected by sense-amplifier circuitry as a "1", while the absence of current is detected as a "0").

Flash E²PROM technology has received industry-wide attention recently. Due to its simple single transistor cell architecture, flash memory may eventually cost less to make than DRAM (Dynamic Random Access Memory).

The channel hot electron programming method, used in conventional flash E²PROM cells, requires biasing the device at high drain voltage (6 to 8 V) to generate hot electrons. This results in additional circuit complexity and cost (ie. an additional external voltage supply), which is a particular disadvantage in mobile applications such as cellular telephones, etc.

Furthermore, the channel hot electron injection method used for programming conventional flash E²PROM cells, generates very high lateral source-to-drain currents (in the range of milliamperes). These high currents limit the number of cells that can be programmed at one time.

Existing flash E²PROM cells also suffer from slow programming speed (~10 μs) which prevents their widespread application as a replacement for RAMs and electronic hard disks. If the device gate length is scaled down in order to reduce the programming time, then punchthrough between the source and drain is likely to occur.

DISCUSSION OF PRIOR ART

A well known early prior art predecessor to modern day flash memory devices is the FAMOS (floating-gate avalanche-injection MOS) memory. This device is described in a number of publications, including: Dov Frohman-Bentchowsky, "A Fully Decoded 2048-Bit Electrically Programmable FAMOS Read-Only Memory"; IEEE Journal of Solid State Circuits, Vol. SC-6, No. 5, October 1971, pp 301–306; Ron D. Katznelson and Dov Frohman-Bentchowsky, "An Erase Model for FAMOS EPROM Devices"; IEEE Transactions on Electron Devices, Vol. ED-27, No. 9, September 1980, pp 1744–1752; and U.S. Pat. No. 4,203,158 (Frohman-Bentchkowsky, et al).

Another prior art flash memory device is described in Masatada Horiuchi and Hisao Katto, "FCAT-A Low-Voltage High Speed Alternative n-Channel Nonvolatile Memory Device"; Transactions on Electron Devices, Vol. ED-26, No. 6, June 1979, pp. 914–918. The FCAT cell has the p⁺ regions placed outside the channel area corners adjacent to the diffused n⁺ source and/or drain regions. This method of positioning the p⁺ regions results in a corner point injection for the hot electrons which contributes to acute stress in the tunnel oxide. Also, the FCAT cell uses hot hole injection into the thin gate oxide for erasure, which can lead to poor reliability and endurance characteristics.

U.S. Pat. No. 5,464,785 entitled "Method of Making A Flash EPROM Device Having A Drain Edge P+ Implant", (Hong et al.), describes a flash EPROM structure with a drain edge p⁺ implant that utilizes the electric field at the junction between the drain and implant to enhance the generation and injection of hot channel electrons during programming operation. According to Hong et al., the drain edge p⁺ implant extends across the entire width of the EPROM cell, thereby preventing lateral current flow through the MOS channel between the source and drain. Therefore, the data stored in the cell cannot be sensed readily.

The fabrication steps suggested by Hong et. al. are impractical since it is very difficult to etch the narrow vertical trenches (reported typically to be 1000 Å wide by 5000 Å high) used for the drain edge p⁺ implant. Also, the fabrication steps imply a dedicated process which is not CMOS compatible.

No read, write, and erase schemes are described in the Hong et al. patent, nor is any evidence of experimental performance indicated.

SUMMARY OF THE INVENTION

According to the present invention, a low voltage flash E²PROM cell is provided which overcomes the above-identified programming speed limitations of conventional prior art flash memory cells, and in addition allows the cell to operate at low voltages.

More particularly, the flash E²PROM cell is comprised of two sections which are butted together. One portion (width-wise) is covered by a highly doped p⁺ pocket implant adjacent to at least one of the n⁺ source and drain regions. This portion is referred to as the program section. The remaining portion (width-wise) is not covered by the highly doped p⁺ pocket implant and resembles a conventional E²PROM cell. This portion is referred to as the sense section.

The highly doped p⁺ pocket implant and the n⁺ drain and/or source regions create a junction having narrow depletion width such that when the junction is reverse biased an electric field is created for generating hot electrons for storage on the floating gate, thereby programming the flash E²PROM. The programming speed of the improved flash E²PROM cell of the present invention is in general an order of magnitude faster than a conventional flash E²PROM cell of the same dimension. The doping concentration of the p⁺ pocket implant is chosen such that the junction will breakdown at low voltages (typically in the range of 2.5 to 5 V), thus enabling the drain and/or source regions to be driven directly by the logic level supply voltages. This eliminates the need for large charge pump circuits with high current capacity as used in conventional flash E²PROMs. The enhancement of hot electron generation results in smaller drain and/or source currents (typically in the range of 50 to 200 µA/µm of cell width) than prior art devices during the programming operation. Thus, the flash E²PROM cell of the present invention consumes much less power, and is more suitable for battery operated portable equipment than similar prior art devices.

High positive and negative voltages are needed only to drive the control gate. Consequently, they can be generated on-chip using simple charge pump circuitry with small current driving capability. The voltages required at the source and drain in all modes of operation can be obtained directly from a low power supply rail.

The flash E²PROM cell of the present invention is compatible with CMOS and BiCMOS processes. More particularly, according to one aspect of the present invention, a method of fabricating an E²PROM cell is provided in which the fabrication steps are modular and compatible with conventional CMOS and BiCMOS process flows. Cell fabrication can be integrated into existing CMOS and BiCMOS processes with minimal changes. The resulting flash E²PROM cell is a self aligned structure. The p⁺ pocket implant is carried out in the same way as the n-LDD implant commonly used in modern CMOS and BiCMOS processes. The generation of hot electrons is dependent on the doping level of the p⁺/n⁺ junction rather than the size of the channel length. The electric field at this junction ($\tilde{~}10^6$ V/cm) significantly exceeds the maximum lateral electric field ($\tilde{~}10^5$ V/cm) available in conventional flash E²PROM cells with short channel lengths (0.3 to 0.5 µm), thus ensuring very efficient injection of hot electrons into the floating gate.

BRIEF INTRODUCTION TO THE DRAWINGS

Detailed descriptions of one prior art flash memory cell and of flash E²PROM cells according to a first embodiment and a preferred embodiment of the present invention are provided herein below, with reference to the following drawings, in which.

Figure 9:
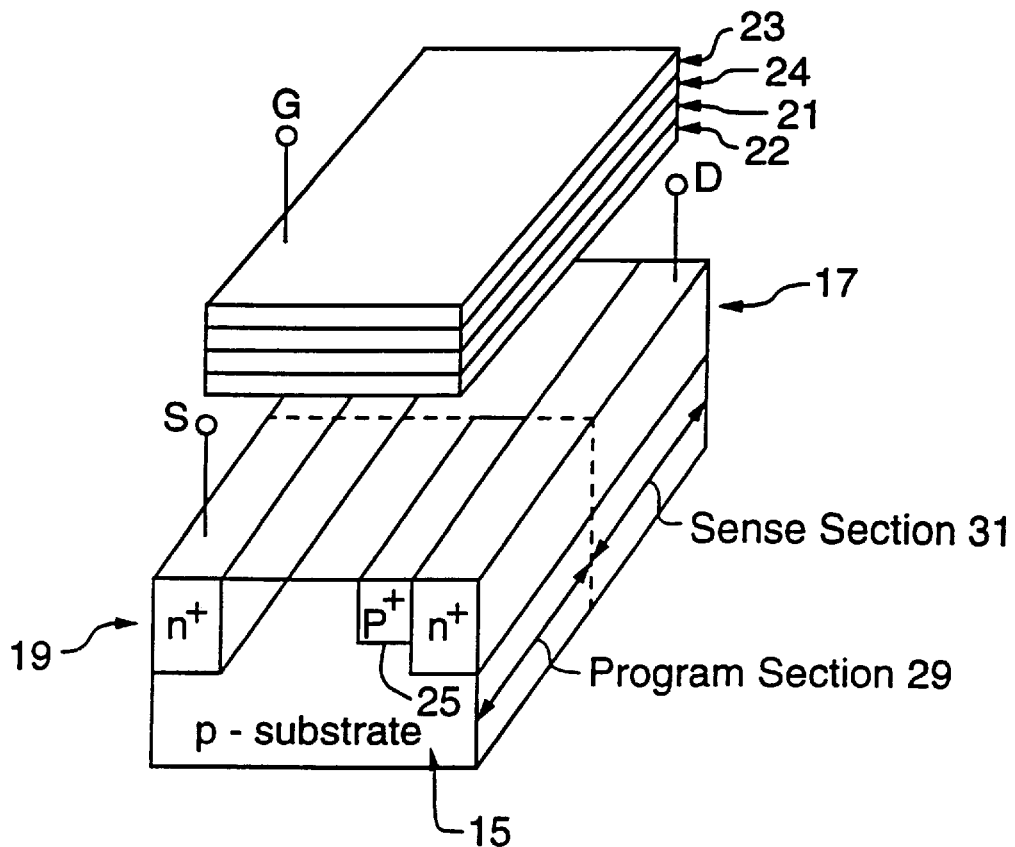
FIG. 9 is a three-dimensional schematic representation of the preferred embodiment of flash E²PROM cell according to the present invention.
Figure 11A:
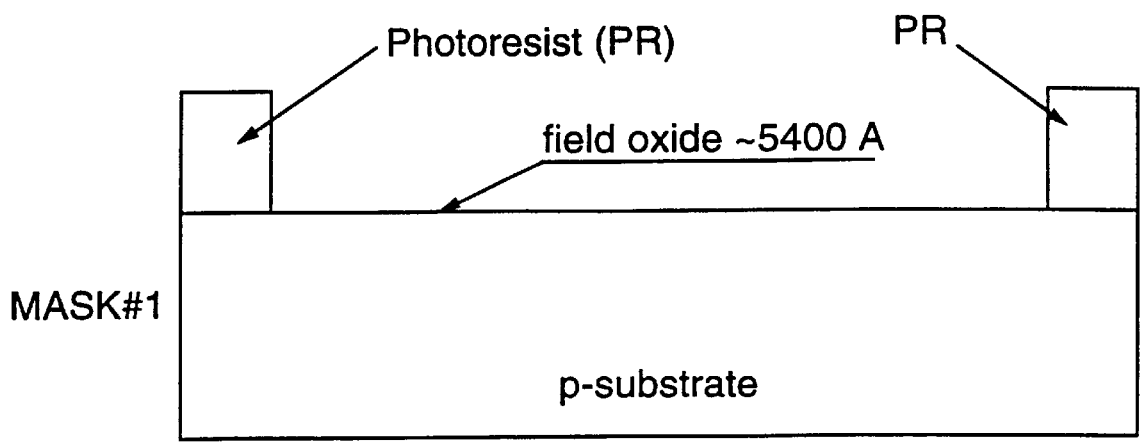
Figure 11B:
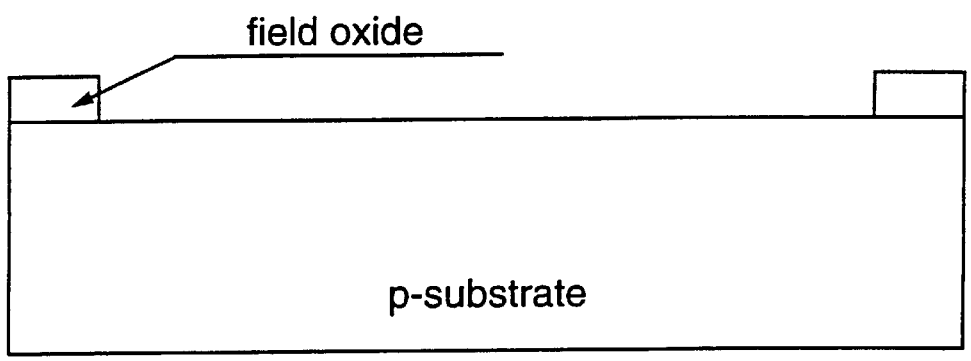
Figure 11C:
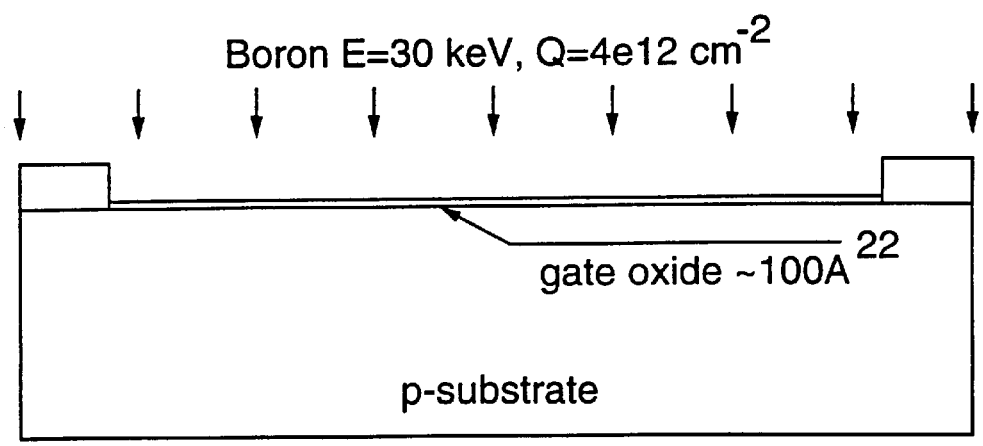
Figure 11D:
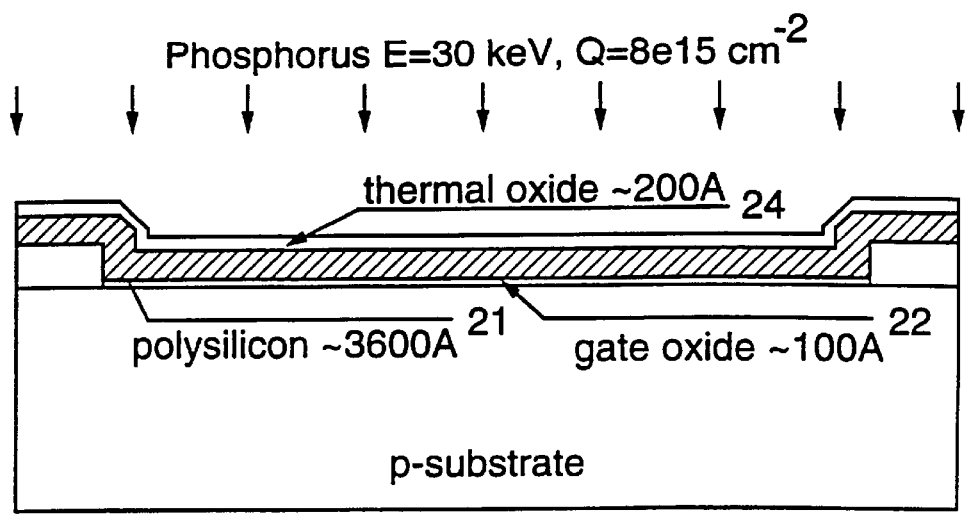
Figure 11E:
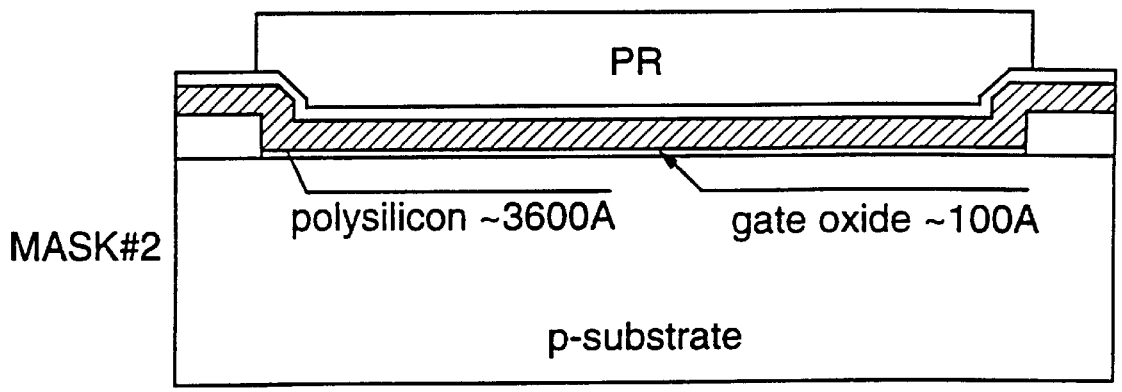
Figure 11F:
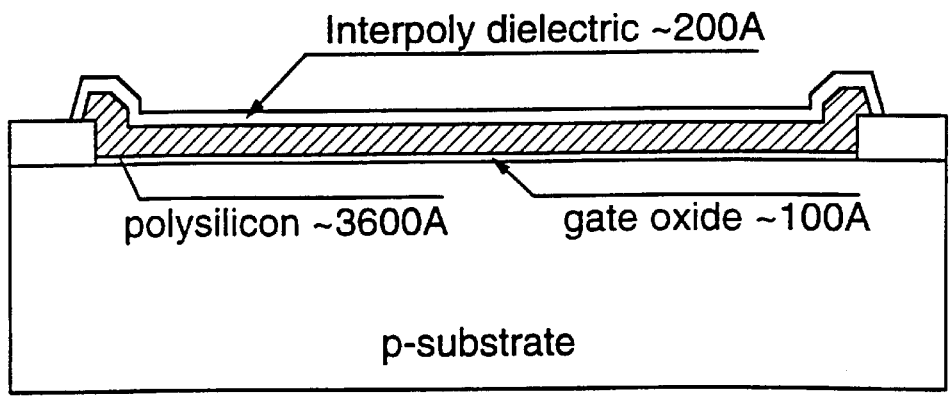
Figure 11G:
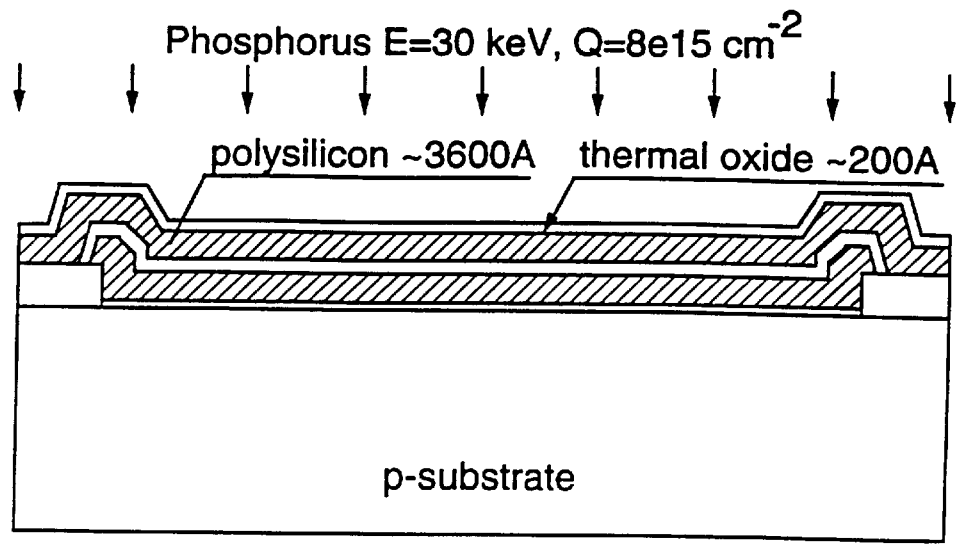
Figure 11H:
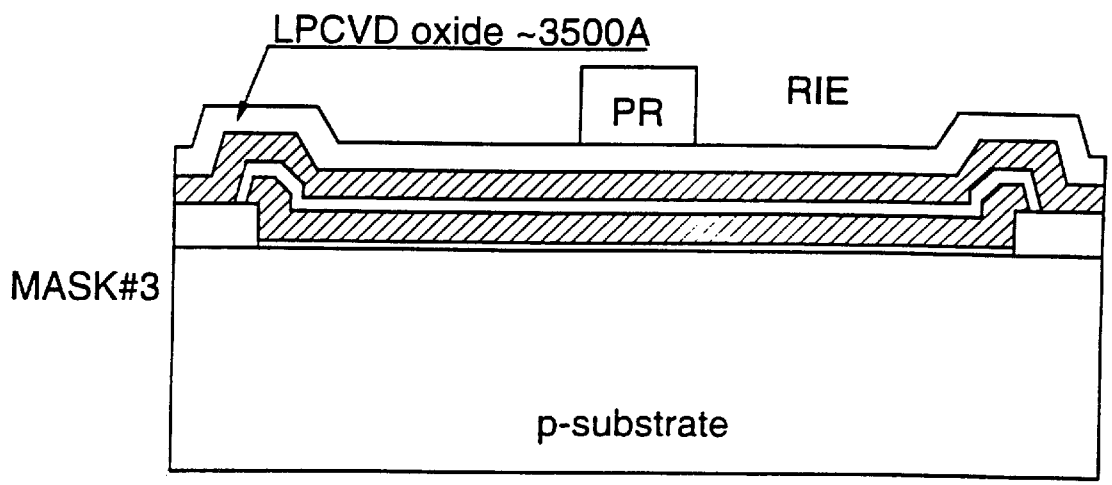
Figure 11I:
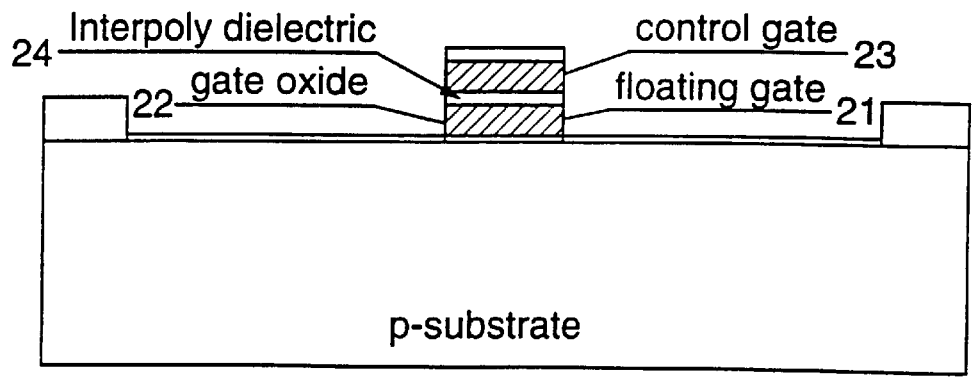
Figure 11J:
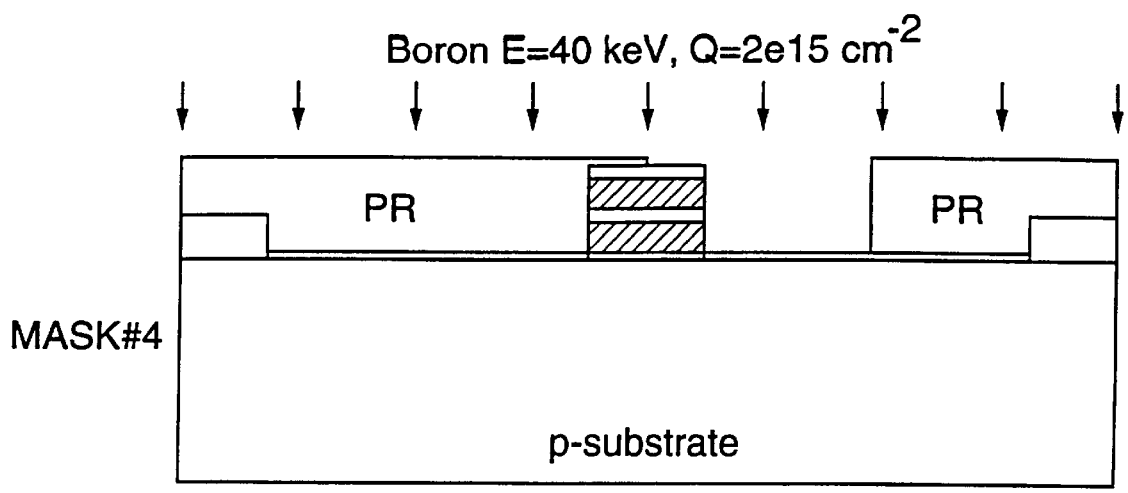
Figure 11K:
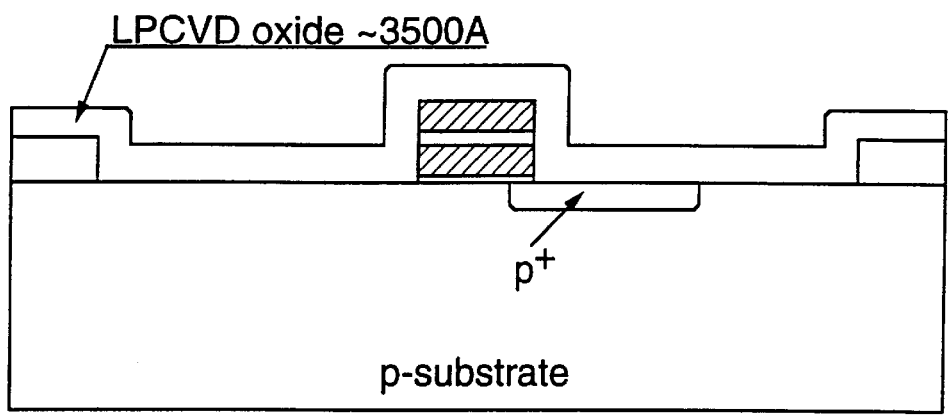
Figure 11L:
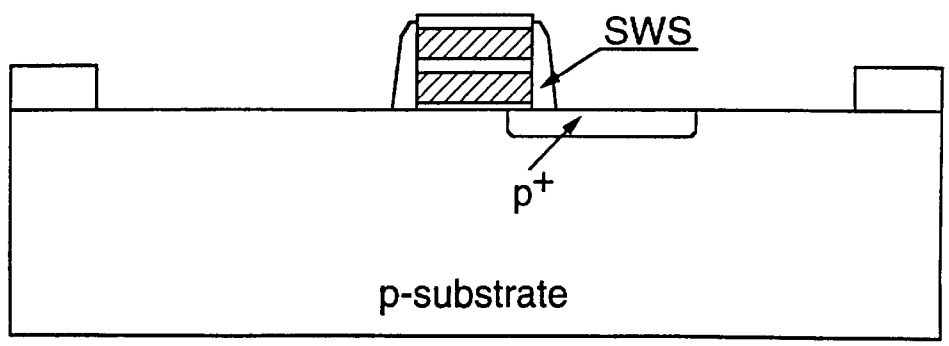
Figure 11M:
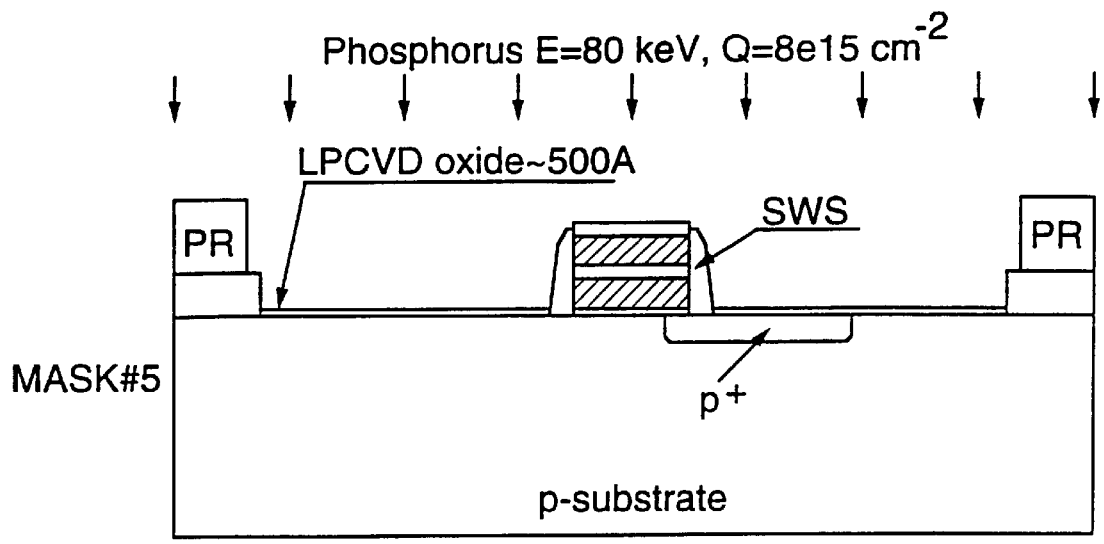
Figure 11N:
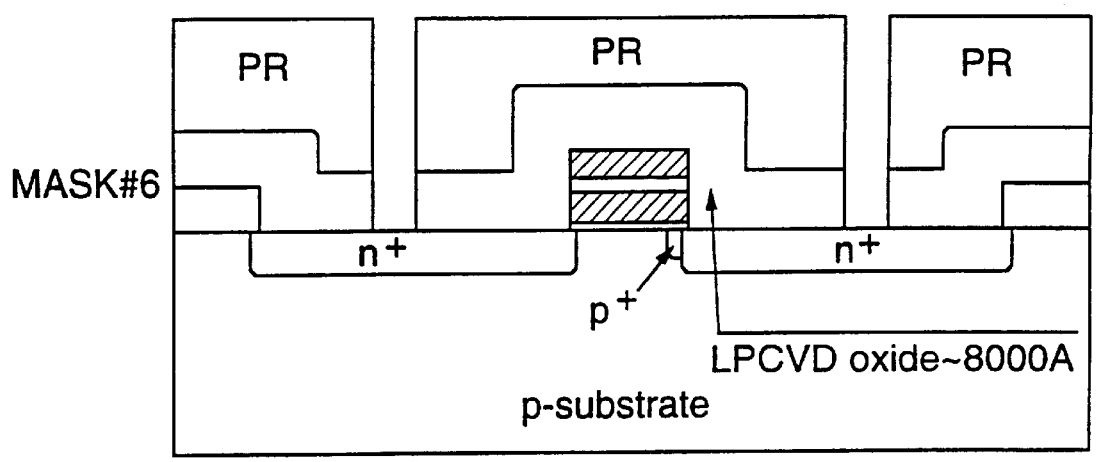
Figure 11O:
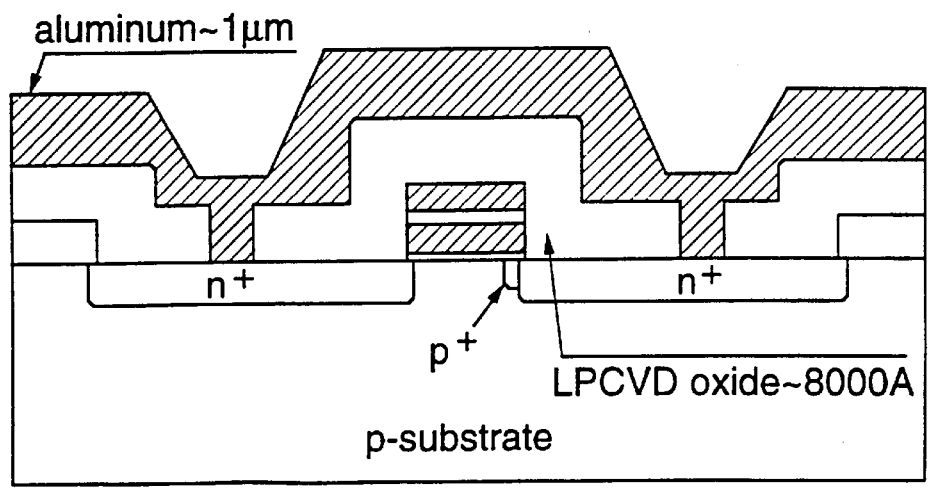
Figure 11P:
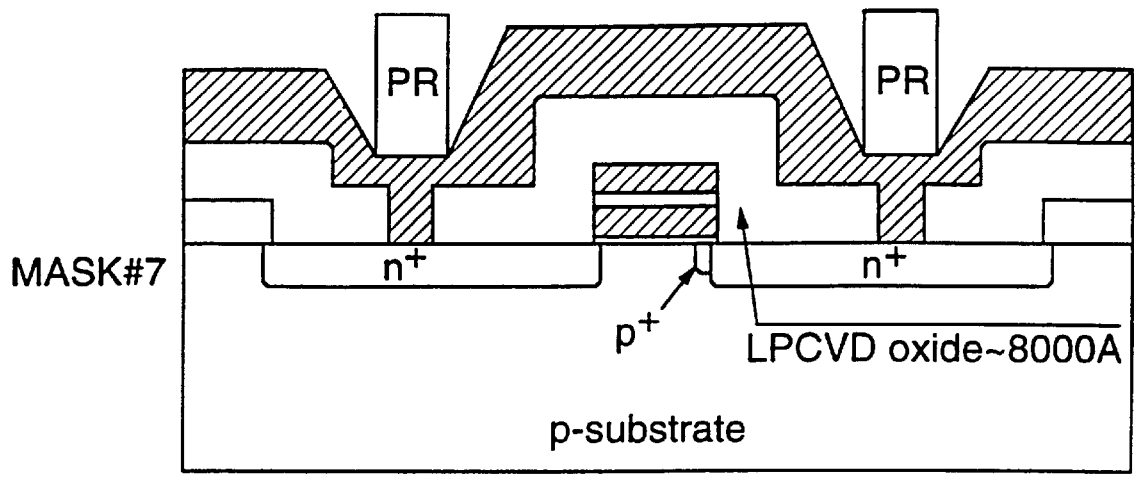
Figure 11Q:
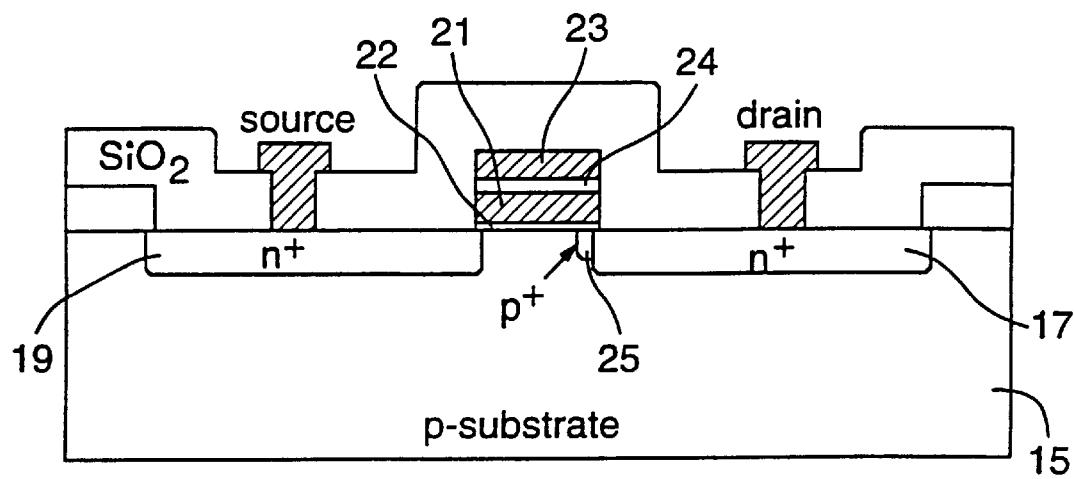
Figure 11R:
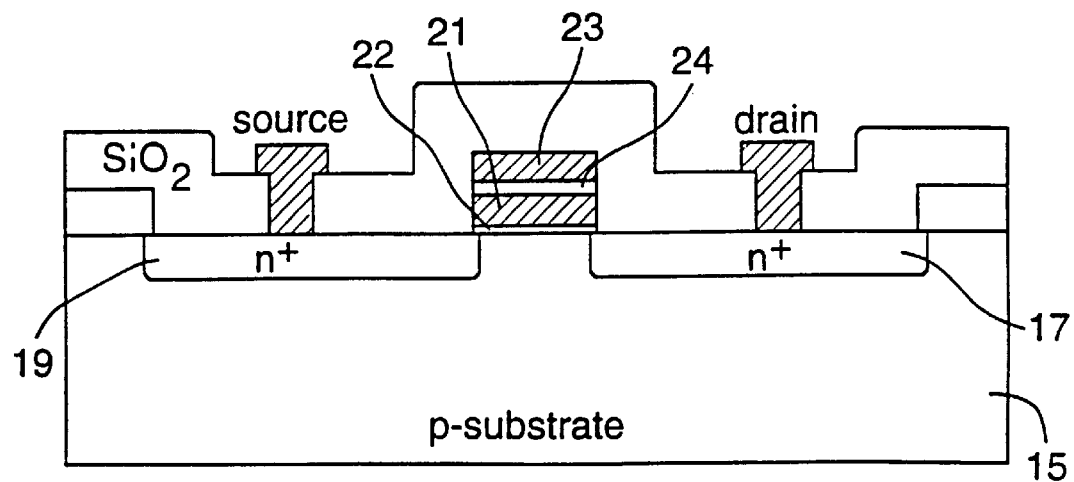
Figure 12A:
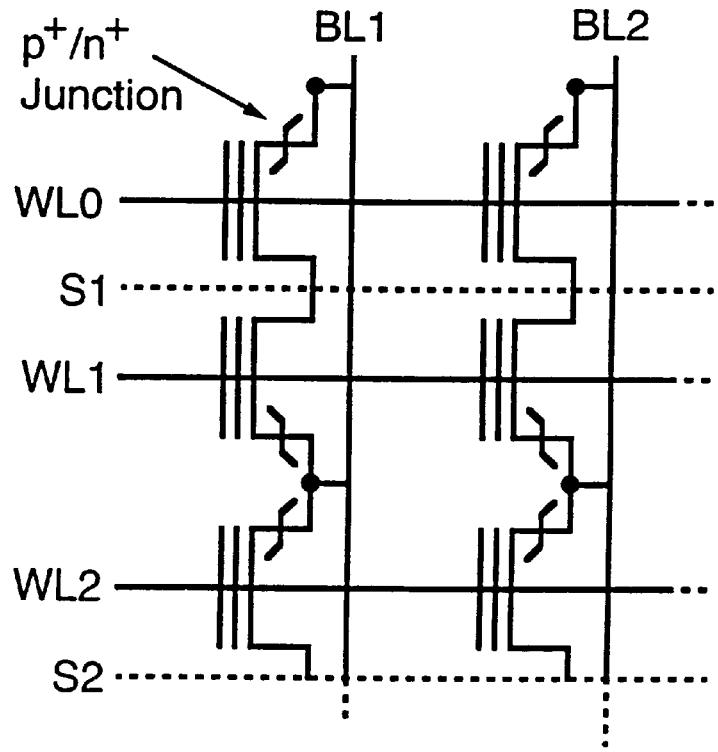
Figure 12B:
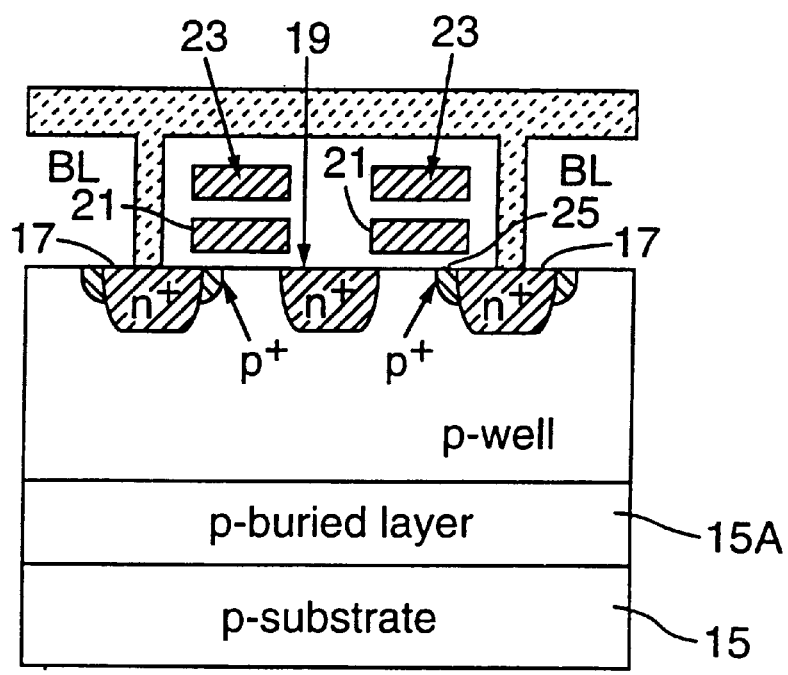
Figure 13:
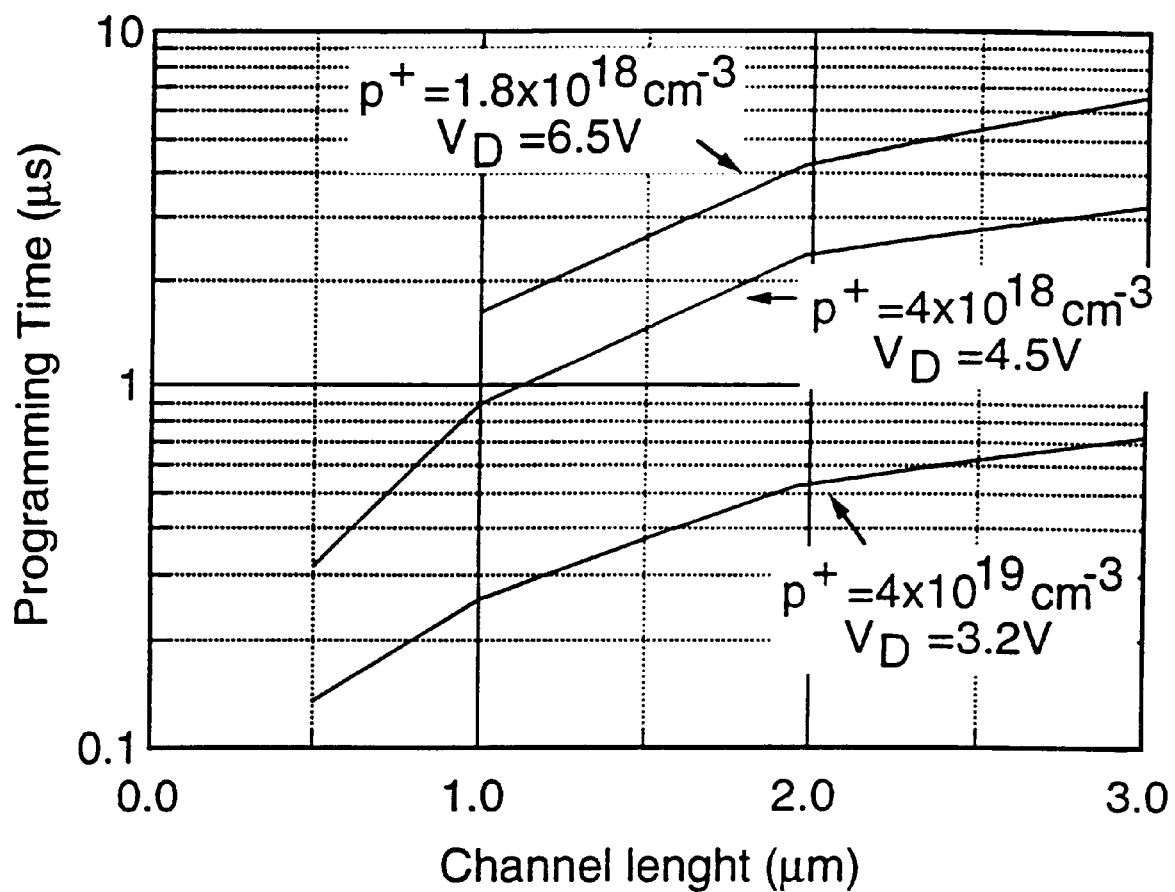
Figure 14:
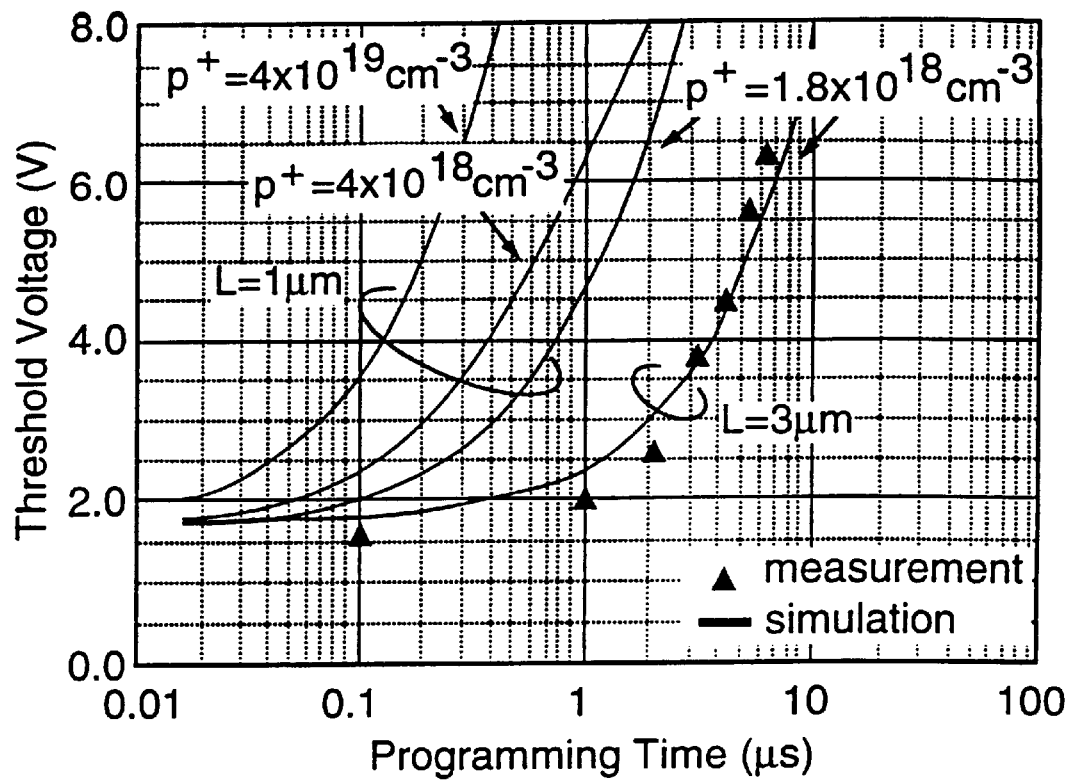
Figure 15:
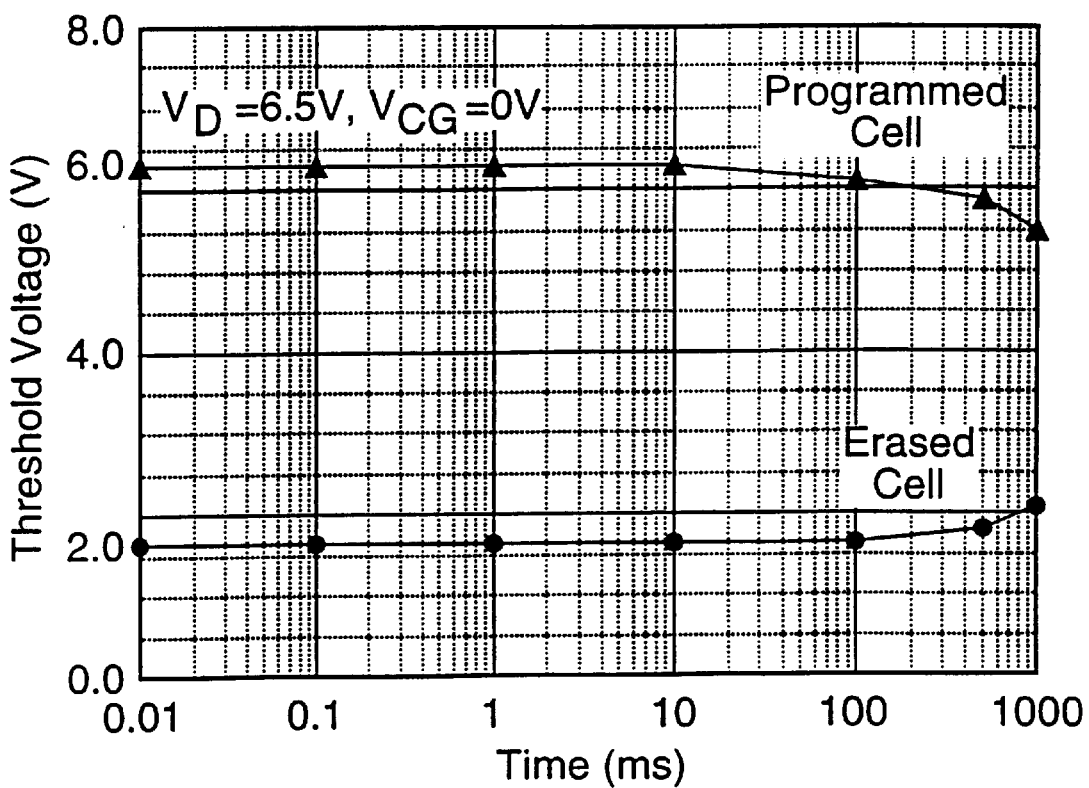

FIGS. 11(a) through 11(r) depict the process flow steps for fabricating the flash E²PROM cell according to the present invention;

FIGS. 12A and 12B show a circuit diagram and cross-sectional diagram, respectively, of the flash E²PROM cell of the preferred embodiment configured in a cross point array architecture;

FIG. 13 shows a simulation of programming time as a function of channel length for different p⁺ doping concentrations for the preferred embodiment of FIG. 9;

FIG. 14 shows simulated and measured programming characteristics for the preferred embodiment of FIG. 9; and FIG. 15 shows the experimental effect of the p⁺/n⁺ junction on the disturb characteristics of a half-selected programmed and erased E²PROM cell according to the preferred embodiment of FIG. 9.

DETAILED DESCRIPTION OF THE PRIOR ART ETOX™ MEMORY CELL

Figure 1:
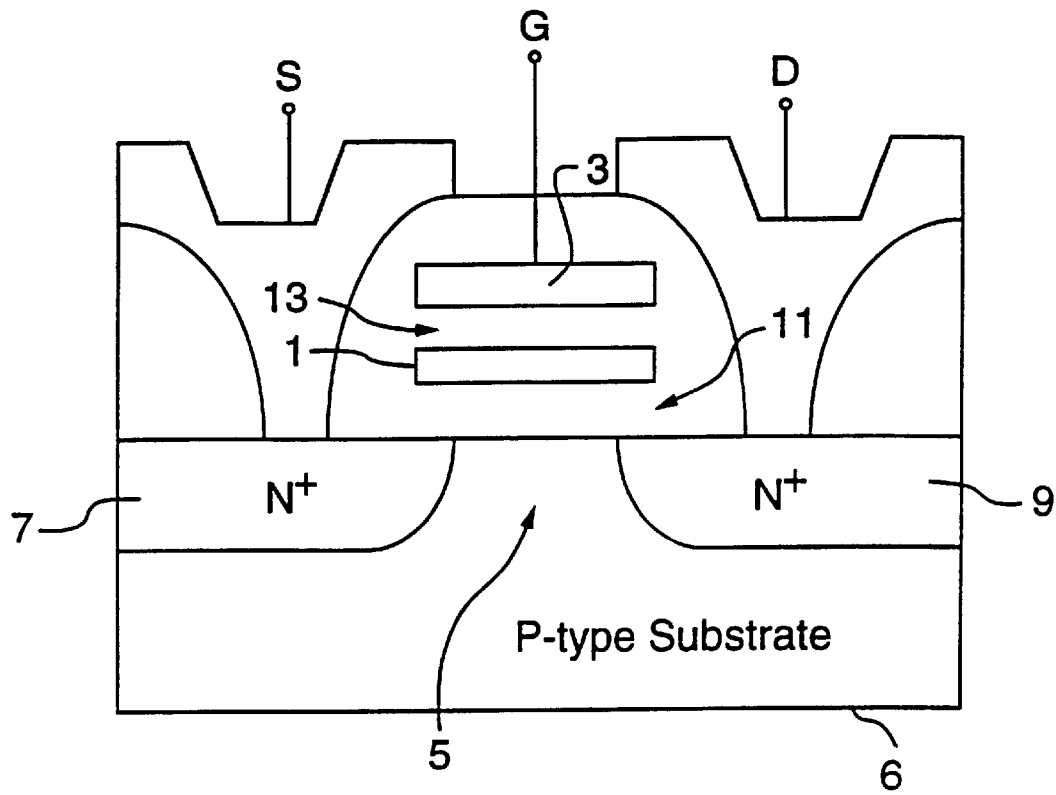
FIG. 1 is a schematic representation of a prior art flash E²PROM cell.

Turning to FIG. 1, a flash E²PROM cell is shown (ETOX™ cell by Intel Corp.), having a floating gate 1 and a control gate 3 stacked vertically above the MOFSET channel 5 in substrate 6 intermediate the source 7 and drain 9. A tunnel oxide 11 is provided intermediate the floating gate 1 and channel 5, and an inter-poly oxide 13 is provided intermediate the floating gate 1 and control gate 3.

Figure 2:
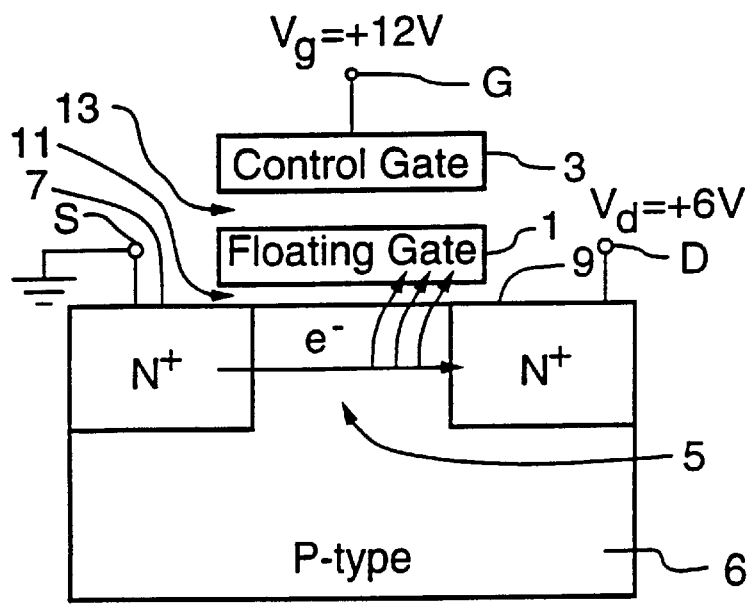
FIG. 2 is a schematic representation of hot electron injection programming of the prior art flash memory cell depicted in FIG. 1.

In order to program the ETOX™ flash memory cell of FIG. 1, a voltage of +12 V is applied to the control gate 3, the source 7 is grounded, and approximately +6 V is applied between source 7 and drain 9 as shown in FIG. 2. As discussed above, the control gate 3 is capacitively coupled to the floating gate 1.

The source-drain voltage (+6 V) generates hot electrons that are swept across the channel 5 from source 7 to drain 9. These hot electrons collide with atoms in the channel 5 thereby creating additional hot electrons. The high voltage (+12 V) on control gate 3 attracts the hot electrons across the thin tunnel oxide 11 where they accumulate on the floating gate 1. When enough electrons have accumulated, the cell switches from its "1" (erased) state to its "0" (programmed) state.

As the floating gate 1 becomes fully charged, the current across the oxide 11 reduces almost to zero as a result of the electric field in the oxide 11 becoming repulsive to additional electron injection from the high electric field region at the drain 9. Therefore, electron injection during programming is a self limiting process.

The voltage applied to the drain 9 does not, in general, have a significant effect on the programmed threshold voltage of the EEPROM cell. However, it does affect the speed of programming of the device.

Figure 3:
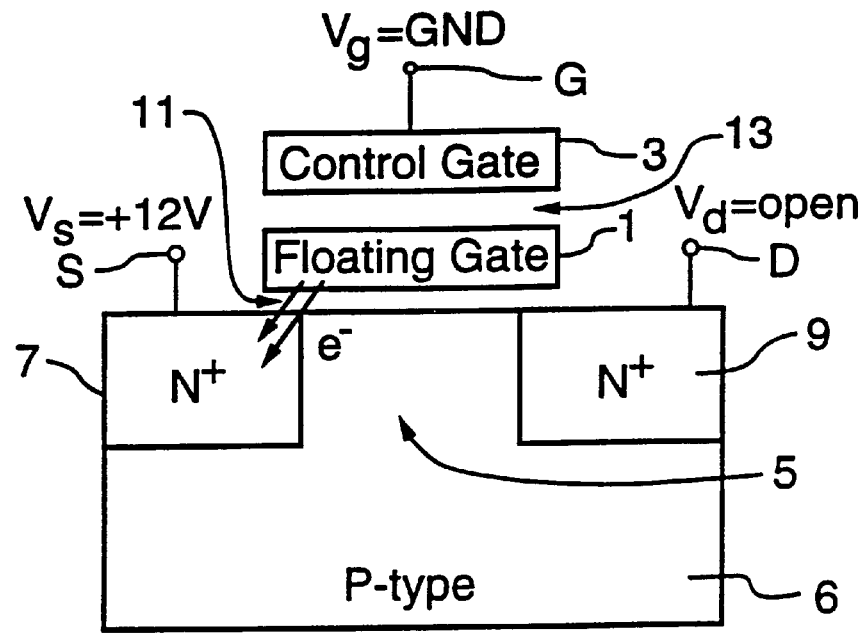
FIG. 3 is a schematic representation of erasure of the prior art flash memory cell depicted in FIG. 1 using Fowler-Nordheim tunnelling across the thin gate oxide.

To erase a flash memory cell, Fowler-Nordheim tunnelling is used to remove electrons from the floating gate 1. More particularly, by floating the drain 9, grounding the control gate 3 and applying +12 V to the source 7, an electric field is generated across the thin tunnel oxide 11 between the floating gate 1 and the source 7. This electric field attracts electrons off of the floating gate 1 toward the source 7, as shown in FIG. 3.

When all of the excess electrons have been removed from the floating gate 1, the threshold voltage ($V_{th}$) returns to its initial value thereby resetting the cell to a "1" state.

Figure 4:
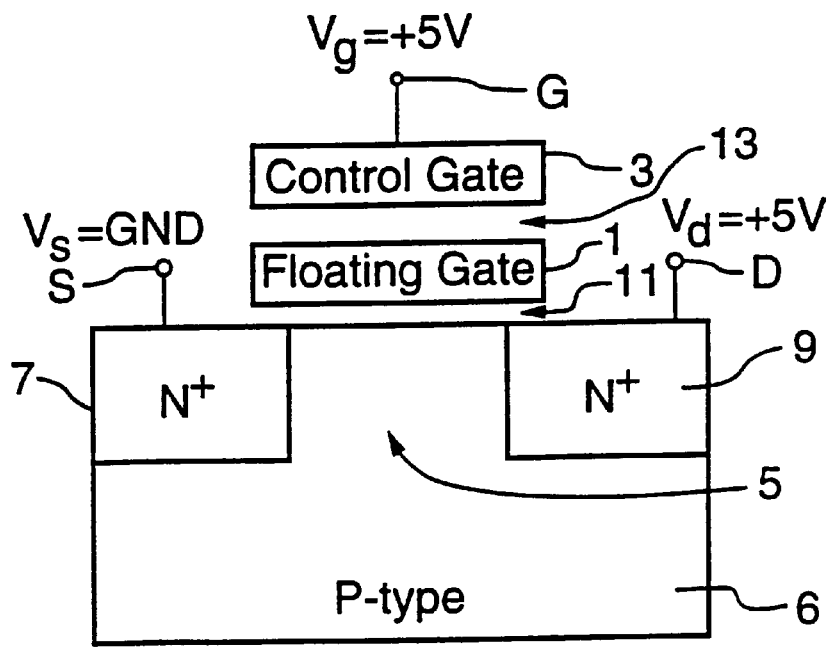
FIG. 4 is a schematic representation of the read operation of the prior art flash memory cell depicted in FIG. 1.

During reading, the prior art ETOX™ memory cell operates like an ordinary transistor. When the flash memory is read, address inputs select specific transistors within the memory cell array. Supply-voltage levels are applied to the control gate 3 and drain 9, while the source 7 is grounded as shown in FIG. 4. By sensing the amount of current that is conducted in the channel 5 between the source 7 and the drain 9, it is possible to determine if the cell has been programmed or erased, as discussed above.

DETAILED DESCRIPTION OF A FIRST EMBODIMENT OF FLASH E²PROM CELL

Figure 5:
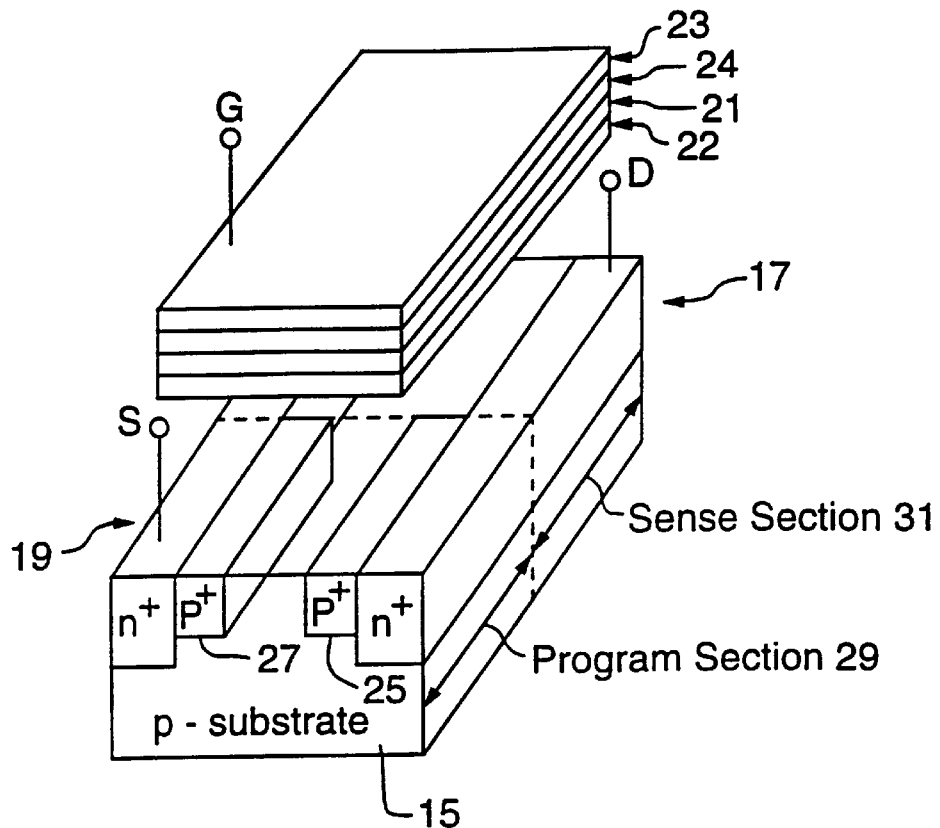
FIG. 5 is a three-dimensional schematic representation of a flash E²PROM cell according to a first embodiment of the present invention.

Turning now to FIG. 5, a flash E²PROM cell is shown for achieving simultaneous reduction of programming time and operating voltages over the prior art cell of FIG. 1.

The cell according to the present invention comprises a substrate 15, drain and source regions 17 and 19, respectively, a floating gate 21 and control gate 23, in the usual manner. Tunnel and inter-poly dielectric layers 22 and 24 are also provided in the usual manner. However, in contrast with the prior art ETOX™ flash memory cell, additional highly doped regions 25 and 27 are provided adjoining the drain and/or source regions 17 and/or 19, respectively. The additional highly doped regions 25 and 27 (occasionally referred to herein as pocket implants) extend along a portion of the width of the cell structure identified as the program section 29, the remaining sense section 31 being provided for the read operation of the cell, as discussed in greater detail below.

In the illustrated embodiment, the substrate is made of p-type material, the drain and source regions are fabricated from $n^+$-type material, and the additional highly doped regions 25 and 27 comprise $p^+$-type regions.

According to the present invention, programming is accomplished via low voltage Zener and/or avalanche breakdown at the reverse biased $p^+/n^+$ junctions in the program section 29. High doping concentrations at these junctions results in a narrow depletion width so that only a small voltage is required to generate a sufficiently strong electric field to create hot electrons for storage on the floating gate 21.

The breakdown mechanism which dominates and the applied voltage required for breakdown depend on the doping of the $p^+$ regions. Computer simulation results have shown that $p^+$ doping concentrations in the range of $1 \times 10^{18}$ cm$^{-3}$ to $5 \times 10^{19}$ cm$^{-3}$ are suitable for the implementation of this structure.

As indicated above, the cell is programmed and read from the program and sense sections 29 and 31, respectively, and erased by Fowler-Nordheim tunnelling of electrons from the floating gate 21 to the source 19.

Figure 6:
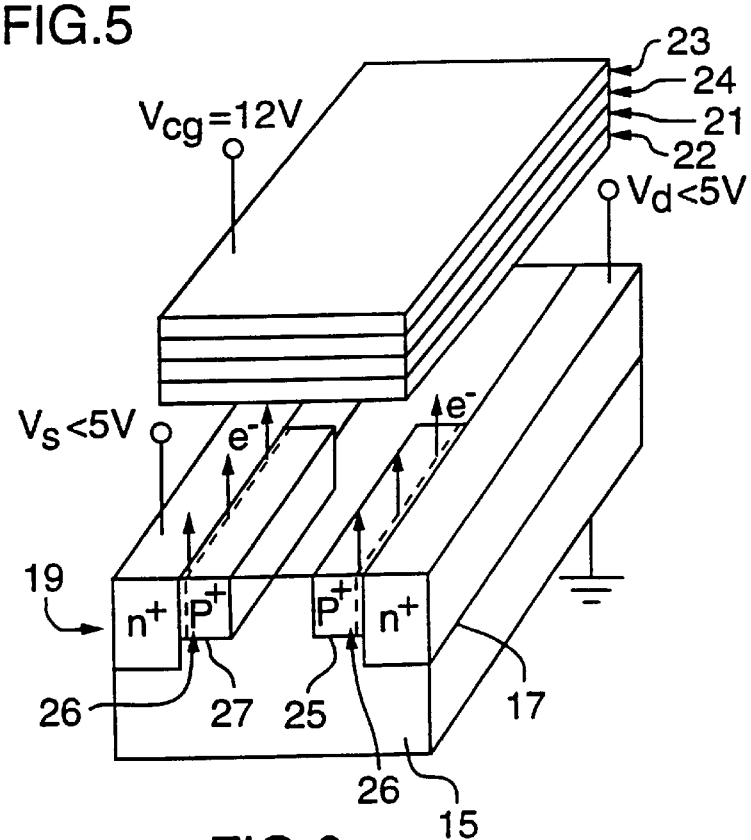
FIG. 6 is a three-dimensional schematic representation of Zener and/or avalanche breakdown-based electron injection programming of the flash E²PROM cell of FIG. 5.

With reference to FIG. 6, a schematic representation of the programming mode of operation is provided. In order to program a logic "0" into the cell, sufficient electrons must be stored on the floating gate 21 to raise the transistor threshold voltage ($V_{th}$) so that the normal read voltage (e.g. 5 Volts) applied to control gate 23 is insufficient to turn the transistor on.

Accordingly, low positive voltages (less than 5 V) are applied to the drain 17 and source 19 while a high programming voltage (in the range of 10 to 15 Volts) is applied to control gate 23. The substrate 15 is grounded. Low voltage Zener and/or avalanche breakdown at the reversed biased $p^+/n^+$ junctions, results in the generation of hot electrons which are drawn to the floating gate 21 as a result of the high voltage applied to control gate 23.

In contrast with the prior art ETOX™ memory cell, the generation of hot electrons necessary to program the flash memory cell of the present invention does not require a large drain-to-source current flow. This is a result of the high electric field (e.g. 10$^6$ V/cm) generated in the narrow depletion regions 26 associated with the heavily doped $p^+/n^+$ junctions.

Figure 7:
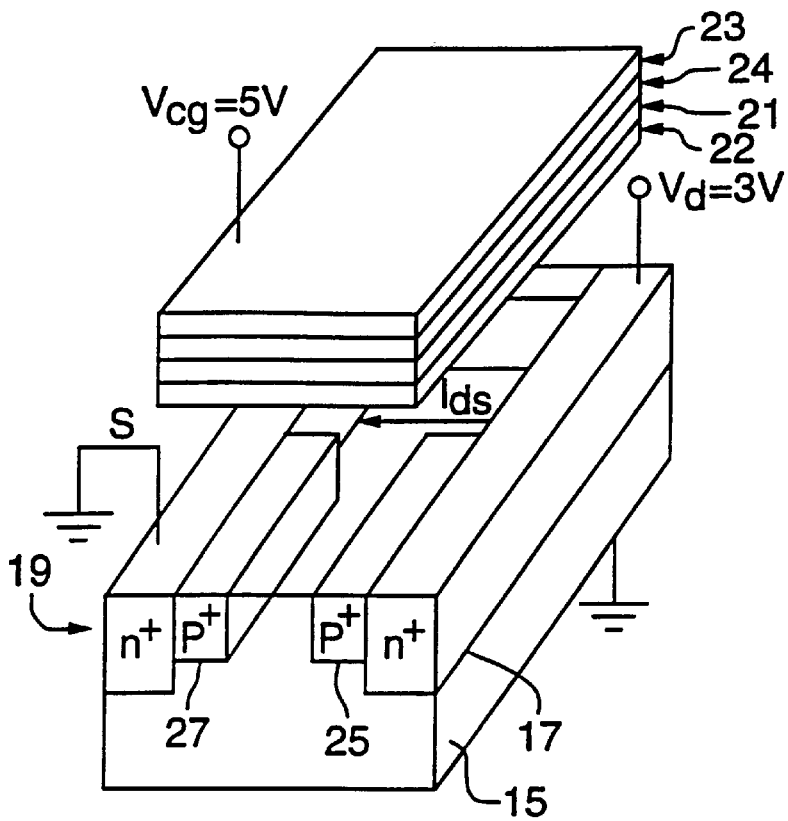
FIG. 7 is a three-dimensional schematic representation of the read operation of the flash E²PROM cell of FIG. 5.

FIG. 7 schematically shows the read mode operation of the flash memory cell according to the present invention. In operation, a low read voltage (e.g. +5 Volts) is applied to control gate 23; a voltage lower than the breakdown voltage of the $p^+/n^+$ junction is applied to the drain 17 (e.g. 3 volts), and the source 19 and substrate 15 are grounded. Operation in the read mode is essentially the same as discussed above with respect to the ETOX™ prior art memory cell. In particular, in an erased cell, the voltage applied to control gate 23 is sufficient to overcome the transistor turn-on threshold voltage ($V_{th}$), and the drain-to-source current is detected in the sense section 31 by sense amplifier circuitry (not shown) and translated into a logic "1". Conversely, in a programmed cell, the added electrons stored on the floating gate 21 raise the transistor turn-on threshold voltage ($V_{th}$) so that the read voltage applied to control gate 23 is insufficient to turn on the transistor. The absence of current is detected in the sense section 31 as a logic "0".

Figure 8:
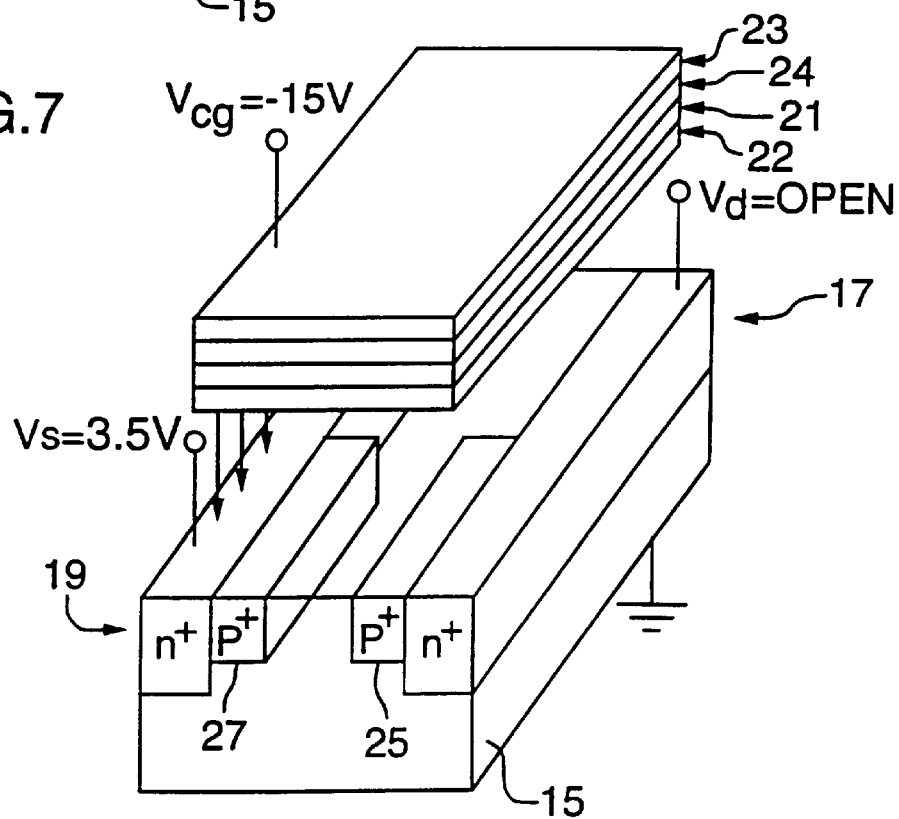
FIG. 8 is a three-dimensional schematic representation of the erasure operation of the flash E²PROM cell of FIG. 5.

Erasure is performed by applying a high negative voltage (in the range of −12 to −15 Volts) to the control gate 23, applying a voltage, lower than the breakdown voltage of the $p^+/n^+$ junction (e.g. +3.5 volts), to the source 17, while grounding the substrate 15 and leaving the drain in an open circuit condition, as shown in FIG. 8. The voltage difference between the control gate 23 and the source 19, creates a strong electric field, across the thin oxide 22 between the floating gate 21 and the source 19, which in turn causes the removal of electrons from the floating gate 21 by Fowler-Nordheim tunnelling.

In summary, the flash E²PROM memory cell according to the present invention, with appropriate $p^+$ dopings and a short gate length, results in extremely fast programming of the cell (in the order of nanoseconds) at low supply voltages, making the cell particularly applicable in the field of portable electronics.

DESCRIPTION OF A PREFERRED EMBODIMENT OF FLASH E²PROM CELL

Figure 10:
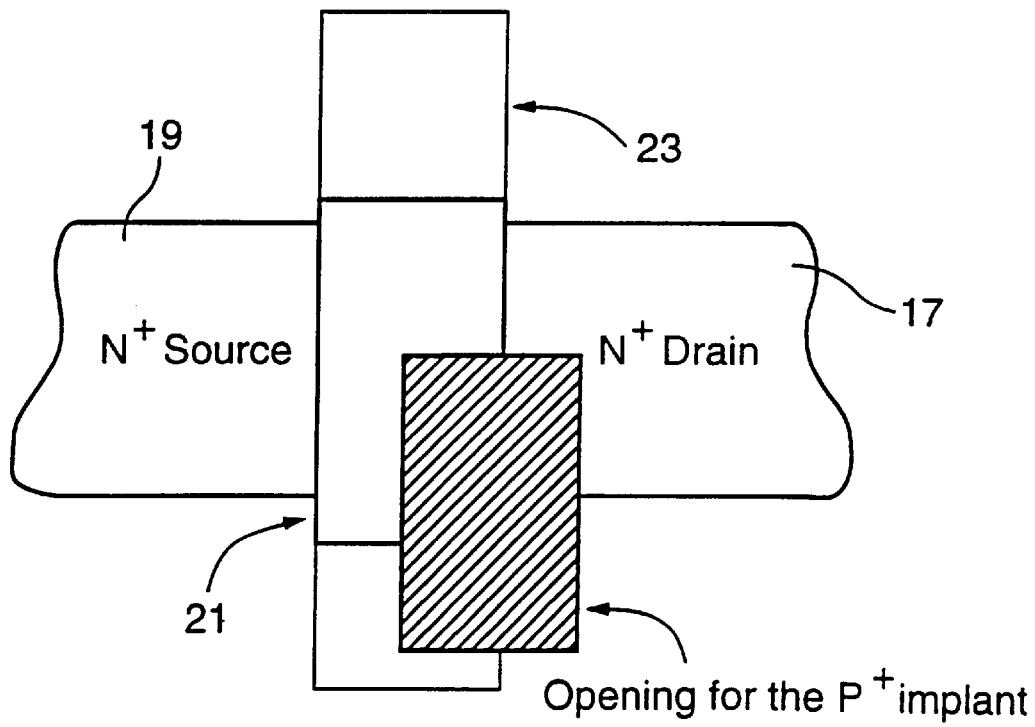
FIG. 10 is a plan view of the device shown in FIG. 9.

The preferred cell structure according to the present invention uses a single $p^+/n^+$ junction in the programming section of the drain region of the transistor, as illustrated in FIGS. 9 and 10. This embodiment offers the advantage that the erasing voltage is not limited by the $p^+/n^+$ junction breakdown voltage, whereby the erasing speed can be improved by applying higher voltages to the source. The cell is programmed from the drain side of the program section, erased from the source side, and read from the sense section of the cell, according to the principles discussed above in connection with FIGS. 5–8.

An improved method of reading the preferred embodiment of flash E²PROM cell shown in FIGS. 9 and 10, comprises the steps of grounding the substrate 15 and drain 17, applying a positive logic level voltage to the control gate 23, and applying a voltage of no greater than logic level to the source region 19. The voltage applied to the control gate 23 allows current to flow through the channel region in the sense section, from the source region to the drain region in the event that little or no charge is stored on the floating gate.

This eliminates possible band to band tunnelling leakage current at the junction of the p+ pocket implant 25 and the n+ drain 17, thus reducing the probability of sensing error on the stored data. The voltage applied to the source region 19 can be higher than the breakdown voltage (typically 3 V or less) of the p+ pocket implant/n+ drain junction, resulting in a higher current flow through the channel during read operation. This will allow faster read time and lower sensing error rate.

Process Flow for Fabricating Flash E²PROM

A detailed description of the flash EEPROM cell fabrication process is given below. All of the steps described are optimized to achieve the appropriate specifications for the flash cells according to the present invention. The wafers used in the fabrication process are p-type (boron doped) with resistivity of 1–1.5 Ohm-cm and orientation <100>. The steps are as follows, with reference to FIGS. 11(a) through 11(r):

1. Grow field oxide on the silicon wafers, to a target oxide thickness of ~5000–7000 Å.
2. Define the device active areas using photolithography (mask #1). The cross-section after this step is shown in FIG. 11(a).
3. Etch the oxide to form the device active area.
4. Remove the photoresist. The cross-section after this step is shown in FIG. 11(b).
5. Grow the tunnelling or gate oxide 22, to a target oxide thickness of 100 Å.
6. Implant boron (energy E=30 keV, dose QI=4×1012 cm−2) for threshold voltage adjustment. The cross-section after this step is shown in FIG. 11(c).
7. Deposit amorphous silicon by low pressure chemical vapor deposition (LPCVD), the target thickness is 3600 Å. The reason for using amorphous silicon is that it results in a smooth surface which is important for the interpoly dielectric growth discussed in greater detail below.
8. Oxidize the amorphous silicon layer, to a target oxide thickness of ⁻200 Å. During this step, the amorphous silicon is converted to polysilicon. The thin oxide is used as a screen oxide during the subsequent ion implantation of phosphorus.
9. Implant phosphorus (energy E=30 keV, dose QI=8×1015 cm−2). This ion implantation step is used for setting the doping of the polysilicon. The cross-section after this step is shown in FIG. 11(d).
10. Perform a rapid thermal anneal to activate the phosphorus and redistribute in the polysilicon after ion implantation.
11. Define the first polysilicon layer using photolithography (mask #2). The cross-section after this step is shown in FIG. 11(e).
12. Etch the thin screen oxide and polysilicon, remove the photoresist and etch the remaining areas of thin oxide.
13. The oxide-nitride-oxide (ONO) interpoly dielectric is grown in this step. The target equivalent thickness is 200 Å. The cross-section after this step is shown in FIG. 11(f).
14. Deposit amorphous silicon by LPCVD to form the control gate 23. The target thickness is 3600 Å.
15. oxidize the deposited amorphous silicon layer, to a target oxide thickness of ⁻200 Å. During this step, the amorphous silicon is converted to polysilicon. The thin oxide is used as a screen oxide during the subsequent ion implantation of phosphorus.
16. Implant phosphorus (energy E=30 keV, dose QI=8×1015 cm−2). This ion implantation step is used for setting the doping of the polysilicon. The cross-section after this step is shown in FIG. 11(g).
17. Deposit LPCVD oxide. The target thickness is ⁻3500 Å. This oxide serves as a mask in Reactive Ion Etching (RIE) of the polysilicon layers.
18. Perform a rapid thermal anneal step to activate the phosphorus implanted in the polysilicon and densify the LPCVD oxide.
19. Define the stacked gate area over LPCVD oxide using photolithography (mask #3). The cross-section after this step is shown in FIG. 11(h).
20. Etch the LPCVD oxide using RIE.
21. Remove the photoresist.
22. Perform a RIE of the second polysilicon layer. The control gate 23 is formed in this step.
23. Perform a RIE of the undesired areas of interpoly oxide 24 and a RIE of the undesired areas of the first polysilicon layer. The floating gate is formed in this step. The remaining undesired areas of the first polysilicon are removed from the source and drain regions. The cross-section after this step is shown in FIG. 11(i).
24. Perform a dry oxidation to ensure that the floating gate is encapsulated by a high quality dielectric layer.
25. Deposit thin LPCVD oxide. The target oxide thickness is ⁻500 Å. This oxide is used as a screen layer during the ion implantation to form the substrate contacts and the P+ region of the Zener injector.
26. Define the windows for boron implantation using photolithography (mask #4). This photolithography process step opens a window through which the p+ region of the Zener junction and the substrate contacts are formed. This step defines the program section of the cell.
27. Implant boron (energy E=40 keV, dose QI=2×1015 cm−2). This ion implantation step is used for implanting the p+ regions of the Zener junction in order to form a junction at the drain side of the gate and also forms the substrate contacts. The cross-section after this step is shown in FIG. 11(j).
28. Remove the photoresist.
29. Etch the thin screen oxide. A wet oxide etch is used in this step.
30. Deposit LPCVD oxide. The target oxide thickness is ⁻3500 Å. This oxide layer is used for the formation of the side wall spacers (SWS).
31. Anneal the wafers to densify the LPCVD oxide and to drive-in boron after the implantation. The cross-section after this step is shown in FIG. 11(k).
32. Etch the deposited LPCVD oxide layer. The side wall spacers (SWS) are formed in this step. Perform a RIE of oxide in the process. The SWS are very important for the location of the p+/n+ junction underneath the gate oxide 22. Experiments show that for this particular stacked gate structure and this range of LPCVD oxide thickness (~3500 Å), the SWS width should be approximately 58% of the LPCVD oxide layer thickness. The cross-section after this step is shown in FIG. 11(l).
33. Deposit thin LPCVD oxide. The target oxide thickness is ⁻500 Å. This oxide is used as a screen layer during the subsequent ion implantation which forms the source and the drain regions.
34. Define windows for phosphorus implantation using photolithography (mask #5). This photolithography process step defines windows through which n+ source and drain regions are implanted. In this step the photoresist covers p+ diffusion regions designed to serve as contacts to the substrate. The windows are open only over the device active area.

35. Implant phosphorus (energy E=80 keV, dose QI=8×1015 cm−2). This ion implantation step is used for implanting the n⁺ source and drain regions 19 and 17. The cross-section after this step is shown in FIG. 11(m).
36. Remove the photoresist and etch the thin screen oxide.
37. Deposit LPCVD oxide. The target oxide thickness is ~8000 Å. This oxide is used as an isolation layer between the devices and the metal layer.
38. Perform a thermal drive-in to form the metallurgical junction of the p⁺/n⁺ injector to be directly underneath the floating gate electrode (on the drain side).
39. Define the contact windows before aluminum deposition using photolithography (mask #6). This photolithography process step defines metal to diffusion and polysilicon contacts.
40. Etch oxide to define contact windows. The cross-section after this step is shown in FIG. 11(n).
41. Remove the photoresist.
42. Sputter aluminum on the wafers. The cross-section after this step is shown in FIG. 11(o).
43. Define the aluminum using photolithography (mask #7). The cross-section after this step is shown in FIG. 11(p).
44. Etch the aluminum.
45. Remove the photoresist.
46. Metal sintering is done in forming gas. The final cross-section of the cell's program section and sense section are shown in FIGS. 11(q) and in FIG. 11(r) respectively.

It should be noted that the p⁺ implant step used to form the injector in the fabrication of this device is similar to the step used in the implementation of the n-LDD implant in a standard CMOS/BiCMOS process flow.

Application of the Flash E²PROM of the Present Invention

The flash E²PROM cell of the preferred embodiment can be configured in a cross point array architecture, as shown in FIGS. 12A and 12B. The p⁺ pocket implant 25 does not necessarily result in a larger cell size since it can be accommodated within the minimum device width. However, the cell exhibits a lower read current. The p-buried layer 15A provides sufficient substrate current extraction to minimize interference with on-chip logic circuits.

Experimental and Test Results

The programming time of the flash E²PROM of the present invention is dependent on the p⁺ region doping levels, and has been found by computer simulation to be at least an order of magnitude less than that of an equivalent dimension conventional flash E²PROM cell operating under the same conditions, as shown in FIG. 13. The decrease in programming time with decreased channel length is mainly due to the reduction in gate area since the channel length has no effect on the generation of hot electrons. A heavily doped p⁺/n⁺ junction between the drain 17 and pocket implant 25 is preferred since breakdown occurs at lower voltages and higher electric field strength, resulting in faster programming speeds. With an appropriate p⁺ doping concentration of >$10^{19}$ cm⁻³ and a short channel length (e.g. −0.5 μm), the programming time is on the order of 150 ns for 3.3 V operation.

Successful prototypes of the flash E²PROM memory cell in accordance with the preferred embodiment have been fabricated using a conventional CMOS process flow as discussed in detail above with reference to FIGS. 11(a) through 11(r). According to the successful prototypes, the device gate length was established as 3 μm, the tunnel oxide 22 thickness was 100 Angstroms and the interpoly oxide 24 was 300 Angstroms. A heavy boron implant was used to form the p⁺ region 25 with an effective doping concentration of approximately $1.8 \times 10^{18}$ cm⁻³.

The measured and simulated programming times plotted in FIG. 14 are seen to be in good agreement. For a 3 μm channel length with p⁺ doping concentration of $1.8 \times 10^{18}$ cm⁻³, the programming time was measured to be 6 μs at a drain bias of 6.5 V which is an order of magnitude smaller than that of an equivalent dimension prior art conventional flash E²PROM cell operating under the same conditions. The drain-to-substrate current was limited to 120 μA per μm of channel width, which is comparable to currents observed in conventional flash E²PROM cells. The erase time was measured at 100 milliseconds which is consistent with prior art device characteristics. Shorter erase times may be obtained by increasing the coupling ratio between the control and floating gates. Furthermore, a measured read current of 100 μA per μm of device width was obtained from the memory cell in the erased state with +3 Volts and +5 Volts applied to the drain 17 and control gate 23, respectively, which is also consistent with prior art operating characteristics.

The effect of the p⁺/n⁺ junction on the disturbed characteristics of half-selected cells is illustrated in FIG. 15. The drain disturbance for programmed cells becomes apparent if the bit-lines are raised high for more than one second. This represents a significant safety margin for sequential programming in a large array. The write/erase endurance characteristics of the cells were also measured to be larger than 10,000 cycles.

Other embodiments and modifications of the invention are possible. For example, as a further alternative to the preferred embodiment of FIG. 9, the pocket p⁺ implant 25 may be located adjacent the source region 19, with minor modifications being necessary to the applied voltage in various modes of operation. Also, an improved version of these devices can be fabricated by using a p⁺ buried layer in the substrate to collect the substrate current generated during the programming operation. All such modifications and alternatives are believed to be within the sphere and scope as defined by the claims appended hereto.

We claim:

1. In a flash E²PROM cell having n⁺ source and drain regions disposed in a p-type substrate, a channel region intermediate to said source and drain regions, a tunnel dielectric layer overlying said channel region, a floating gate overlying said tunnel dielectric layer, an inter-poly dielectric layer overlying said floating gate and a control gate overlying said inter-poly dielectric layer, the improvement comprising a highly doped p⁺ pocket implant adjoining one of said drain and source regions along a portion of the width of said cell for creating a metalurgical junction having narrow depletion width, said portion of the width of said cell defining a program section of said cell and the remaining width of said cell defining a sense section thereof.

2. The improvement of claim 1, wherein said p⁺-type material has a doping concentration in the range of from $1 \times 10^{18}$ cm⁻³ to $1 \times 10^{20}$ cm⁻³.

3. The improvement of claim 1, wherein said metallurgical junction is driven in so as to be positioned directly beneath said floating gate.

4. A method of programming the improved flash E²PROM cell of claim 1, comprising the steps of:
   a) grounding said substrate;
   b) applying a low positive voltage to said one of said drain and source regions adjoining said p⁺ pocket implant, whereby said junction becomes reverse biased and one of either low voltage Zener or avalanche breakdown occurs resulting in generation of hot electrons; and c) applying a high positive voltage to said control gate, whereby said hot electrons are attracted to said floating gate.

5. A method of erasing the improved flash E²PROM cell of claim 1, comprising the steps of:

a) grounding said substrate;
   b) applying a less than logic level voltage to the other of said drain and source regions;
   c) leaving said one of said drain and source regions adjoining the p⁺ pocket implant in an open circuit condition; and
   d) applying a high negative voltage to said control gate, whereby a strong electric field is generated between said floating gate and said other of said drain and source regions resulting in removal of electrons from said floating gate to said other of said drain and source regions by Fowler-Nordheim tunneling.

6. A method of reading the improved flash E²PROM cell of claim 1, comprising the steps of:

a) grounding said substrate and said source region;
   b) applying a logic level voltage to said control gate; and
   c) applying a voltage less than breakdown voltage of said junction to said drain region, whereby said voltage applied to the control gate causes current to flow through said channel region in said sense section from said drain region to said source region.

7. A method of reading the improved flash E²PROM cell of claim 1, comprising the steps of:

a) grounding said substrate and said one of said drain and source regions adjoining said p⁺ pocket implant;
   b) applying a positive logic level voltage to said control gate;
   c) applying a voltage of no greater than logic level to said other one of said source and drain regions, whereby said voltage applied to the control gate allows current to flow through said channel region in said sense section, from said source region to said drain region in the event that little or no charge is stored on said floating gate.

8. In a flash E²PROM cell having n⁺ source and drain regions disposed in a p-type substrate, a channel region intermediate to said source and drain regions, a tunnel dielectric layer overlying said channel region, a floating gate overlying said tunnel dielectric layer, an inter-poly dielectric layer overlying said floating gate and a control gate overlying said inter-poly dielectric layer, the improvement comprising a pair of highly doped p⁺ pocket implants adjoining respective ones of said drain and source regions along a portion of the width of said cell for creating a pair of metalurgical junctions each having narrow depletion width, said portion of the width of said cell defining a program section of said cell and the remaining width of said cell defining a sense section thereof.

9. The improvement of claim 8, wherein said p⁺-type material has a doping concentration in the range of from $1 \times 10^{18}$ cm⁻³ to $1 \times 10^{20}$ cm⁻³.

10. The improvement of claim 8, wherein said metallurgical junctions are driven in so as to be positioned directly beneath said floating gate.

11. A method of programming the improved flash E²PROM cell of claim 8, comprising the steps of:

a) grounding said substrate;
   b) applying a low positive voltage to each of said drain and source regions, whereby said junctions become reverse biased and one of either low voltage Zener or avalanche breakdown occurs resulting in generation of hot electrons; and
   c) applying a high positive voltage to said control gate, whereby said hot electrons are attracted to said floating gate.

12. A method of erasing the improved flash E²PROM cell of claim 8, comprising the steps of:

a) grounding said substrate;
   b) applying a voltage less than breakdown voltage of said junction to one of said drain and source regions;
   c) leaving the other of said drain and source regions in an open circuit condition; and
   d) applying a high negative voltage to said control gate, whereby a strong electric field is generated between said floating gate and said one of said drain and source regions resulting in removal of electrons from said floating gate to said one of said drain and source regions by Fowler-Nordheim tunnelling.

13. A method of reading the improved flash E²PROM cell of claim 8, comprising the steps of:

a) grounding said substrate and said source region;
   b) applying a low voltage to said control gate; and
   c) applying a voltage less than breakdown voltage of said junction to said drain region, whereby said voltage applied to the control gate causes current to flow through said channel region in said sense section from said drain region to said source region.

14. The improvement of claim 2, wherein said metallurgical junction is driven in so as to be positioned directly beneath said floating gate.

15. The improvement of claim 9, wherein said metallurgical junctions are driven in so as to be positioned directly beneath said floating gate.

* * * * *